(12) United States Patent
Kurita et al.

(10) Patent No.: US 7,468,197 B2
(45) Date of Patent: Dec. 23, 2008

(54) FLEXIBLE METAL-CLAD LAMINATE AND METHOD FOR PRODUCING THE SAME

(75) Inventors: Tomoharu Kurita, Otsu (JP); Chyuji Inukai, Otsu (JP)

(73) Assignee: Toyo Boseki Kabushiki Kaisha, Osaka (JP)

( * ) Notice: Subject to any disclaimer, the term of this patent is extended or adjusted under 35 U.S.C. 154(b) by 94 days.

(21) Appl. No.: 11/503,438

(22) Filed: Aug. 11, 2006

(65) Prior Publication Data

US 2007/0009710 A1    Jan. 11, 2007

Related U.S. Application Data

(63) Continuation of application No. 09/921,358, filed on Aug. 2, 2001, now abandoned.

(30) Foreign Application Priority Data

Aug. 4, 2000 (JP) ............................. 2000-237389

(51) Int. Cl.
    *B05D 3/02* (2006.01)
(52) U.S. Cl. ................. 427/177; 427/178; 427/350; 427/379; 427/384; 427/385.5; 427/388.1; 427/388.2; 427/388.5
(58) Field of Classification Search ........... 427/379, 427/384, 385.5, 388.1, 388.2, 388.5, 177, 427/178, 350
See application file for complete search history.

(56) References Cited

U.S. PATENT DOCUMENTS

| | | |
|---|---|---|
| 3,897,393 A | 7/1975 | Lu |
| 3,936,575 A | 2/1976 | Watanabe et al. |
| 3,984,375 A | 10/1976 | Frost |
| 4,058,503 A | 11/1977 | Yukuta |
| 4,167,620 A | 9/1979 | Chen |
| 4,377,652 A | 3/1983 | Ohmura |
| 4,411,952 A * | 10/1983 | Sasaki et al. ............... 428/332 |
| 4,433,131 A | 2/1984 | Bolon |
| 4,792,476 A | 12/1988 | Numata |
| 4,970,107 A | 11/1990 | Akahoshi |
| 5,919,517 A * | 7/1999 | Levendusky et al. ........ 427/211 |
| 6,713,154 B1 * | 3/2004 | Tsunogae et al. .......... 428/131 |

FOREIGN PATENT DOCUMENTS

| | | |
|---|---|---|
| JP | 57-066690 A | 4/1982 |
| JP | 62-181488 A | 8/1987 |
| JP | 02-098994 A | 4/1990 |
| JP | 03-131630 A | 6/1991 |
| JP | 03-164240 A | 7/1991 |

OTHER PUBLICATIONS

Abstracts and partial machine translation of JP 2000 - 022290, Jan. 2000.*

* cited by examiner

*Primary Examiner*—Erma Cameron
(74) *Attorney, Agent, or Firm*—Leydig, Voit & Mayer, Ltd.

(57) ABSTRACT

Disclosed are a flexible metal-clad laminate comprising a metal foil and a heat-resistant resin film layer formed on one side of the metal foil, the heat-resistant resin film layer comprising a crosslinked condensation polymer and having an N-methyl-2-pyrrolidone-insolule content of at least 1%, and a method for producing the flexible metal-clad laminate comprising the steps of applying a heat-resistant resin solution to a metal foil; predrying the metal foil until the heat-resistant resin layer has an residual solvent content of 10 to 40% by weight; and carrying out solvent removal and heat-treatment while controlling the crosslinking reaction of the resin.

9 Claims, 3 Drawing Sheets

FLEXIBLE METAL-CLAD LAMINATE AND METHOD FOR PRODUCING THE SAME

CROSS-REFERENCE TO RELATED APPLICATION

This patent application is a continuation of U.S. patent application Ser. No. 09/921,358, filed Aug. 2, 2001 now abandoned.

FIELD OF THE INVENTION

The present invention relates to a flexible metal-clad laminate which is for use in flexible printed boards and has high dimensional stability, heat resistance, chemical resistance (especially alkali resistance), adhesion and the like, and to a method for producing the same. More specifically, the present invention relates to a flexible metal-clad laminate produced by continuously applying a heat-resistant resin solution to a metal foil and then subjecting the laminate to predrying and heat-treatment, the metal-clad laminate having high dimensional stability, heat resistance, chemical resistance and adhesion, and to a method for producing the same.

In the present specification and claims, the term "flexible metal-clad laminate" means a laminate comprising a metal foil and a resin layer, for example, a laminate which is useful for producing flexible printed wiring boards and the like.

PRIOR ART

Conventional flexible metal-clad laminates for flexible printed boards comprise a polyimide film and a metal foil bonded by an epoxy resin, acrylic resin or like thermosetting adhesive. These flexible printed boards bonded by a thermosetting adhesive, which have thermal characteristics much lower than those of polyimide films, have the problems of limited application to chip-on-flex and blisters, peeling and other problems associated with soldering. Such flexible printed boards also have the drawback of curling and twisting in the boards caused by the thermal hysteresis resulting from processing such as thermocompression bonding. This curling and twisting makes the punching process to be carried out afterward difficult.

In order to solve these problems, techniques to form a metal foil directly on an insulating substrate without using an adhesive have been developed. For example, some patent publications suggest forming a metal layer on a polyimide film by sputtering (Japanese Unexamined Patent Publication No. 1990-98994), by vacuum evaporation (No. 1987-181488), or by ion plating (No. 1982-18357), and then forming circuit patterns thereon. However, all of these methods have the problem of high production costs and insufficient adhesion between the polyimide film and conductor. Specifically, such methods are disadvantageous in that electroplating on patterns to increase their strength may tear them off and exposure to heat at about 100° C. may lower the adhesion between the conductor and polyimide film.

In order to more economically produce a flexible printed board without an adhesive layer, Japanese Unexamined Patent Publications No. 1982-50670, 1982-66690, etc., propose applying a polyimide-based solution directly to a metal foil.

However, the flexible metal-clad laminates produced by such methods are problematic because a decrease in the volume of the solvents or a difference between the coefficients of thermal expansion of the resin and the copper foil, etc., induce internal stress which makes the metal-clad laminate curl toward the resin layer side. Japanese Unexamined Patent Publications Nos. 1980-75289, 1979-111673, 1979-31480, etc., discloses straightening such curled laminates by heat treatment at a high temperature, by stretching them during drying and curing step, or by heat treatment after winding them around a cylindrical drum, among other methods. However, none of these methods can straighten the curled laminates satisfactorily. These methods also have the problem that the films obtained by etching the metal foil curl. In addition, continuous production of the laminates entails lower productivity or require expensive equipment, and thus these methods have the problem of high production costs.

Further, a laminate produced by the above method comprising directly applying a polyimide-based solution onto a substrate and drying it has insufficient alkali resistance. Accordingly, in various applications, such laminates are not suitable for producing flexible printed wiring boards for use in products which involve the use of alkaline substances, such as ink jet printers (which usually use alkaline inks).

SUMMARY OF THE INVENTION

An object of the present invention is to solve the above-mentioned problems by applying a heat-resistant resin solution directly to a metal foil and drying the solution to economically produce a flexible metal-clad laminate for flexible printed boards, the laminate having high heat resistance, dimensional stability, adhesion, chemical resistance, alkali resistance, etc., and having no curling.

The inventors of the present invention conducted extensive research to achieve the above object. Consequently, they found the following:

(a) A condensation polymer layer having an N-methyl-2-pyrrolidone-insoluble content of at least 1% can be obtained by continuously applying to a metal foil a solution prepared by dissolving an organic solvent-soluble heat-resistant condensation polymer in the organic solvent, predrying the resulting coating film so as to leave at least a certain amount of the solvent, and heat-treating the predried coating film under specific conditions to effect a controlled crosslinking reaction of the condensation polymer.

(b) The thus obtained crosslinked condensation polymer layer has excellent characteristics such as high heat resistance, dimensional stability, chemical resistance, adhesion, etc., as well as high alkali resistance.

(c) Since internal stress is inhibited or reduced in the resulting metal-clad laminate, the flexible metal-clad laminate does not curl and a heat-resistant resin film obtained by etching and removing the metal foil from the flexible metal-clad laminate does not curl either. Therefore, a flexible metal-clad laminate from which circuit patterns are formed by etching the unnecessary metal foil does not curl. Thus, a flexible metal-clad laminate can be produced economically.

The present invention was accomplished based on the above finding and further consideration. The present invention provides the following flexible metal-clad laminates and their production methods.

(1) A flexible metal-clad laminate comprising a metal foil and a heat-resistant resin film layer formed on one side of the metal foil, the heat-resistant resin film layer comprising a crosslinked condensation polymer and having an N-methyl-2-pyrrolidone-insoluble content of at least 1%, particularly 1 to 99%. The flexible metal-clad laminate according to item (1), wherein the heat resistant resin film layer is formed by converting an organic solvent-soluble condensation polymer by crosslinking into an organic solvent-insoluble form.

(2) The flexible metal-clad laminate according to item (1), wherein the heat-resistant resin film layer is formed by applying to the metal foil a solution prepared by dissolving an organic solvent-soluble condensation polymer in the organic solvent and subjecting the coated metal foil to a predrying step and a heat-treatment and solvent removal step.

(3) The flexible metal-clad laminate according to any one of items (1) to (3), wherein the heat-resistant resin film has an initiation tear strength (film thickness: 20 μm) of at least 15 kg and has a thermal gradient dimensional change of not more than 0.1% when heated at 200° C. for 30 minutes.

(4) The flexible metal-clad laminate according to any one of items (1) to (4), which has a solder heat resistance of at least 350° C., an adhesion between the metal foil and the heat-resistant resin film of at least 80 g/mm and a radius of curvature of at least 15 cm.

(5) The flexible metal-clad laminate according to any one of items (1) to (5), wherein the average surface roughness Ra of the surface of the heat-resistant resin film layer which is in contact with the metal foil is not more than 0.4 μm.

(6) The flexible metal-clad laminate according to any one of items (1) to (6), wherein the elastic modulus retentivity of the heat-resistant resin film after being immersed in an aqueous solution of sodium hydroxide (concentration: 40% by weight) at 25° C. for 100 hours is at least 40%.

(7) The flexible metal-clad laminate according to any one of items (1) to (7), wherein the condensation polymer contains the unit represented by formula (1)

(1)

wherein $R^1$ and $R^2$ are the same or different and each represents hydrogen or an alkyl or alkoxy group having 1 to 4 carbons atoms and/or the unit represented by formula (2)

(2)

(8) A method for producing the flexible metal-clad laminate as set forth in any one of items (1) to (8), the method comprising the steps (A) and (C):

(A) applying to the metal foil a solution prepared by dissolving a heat-resistant resin comprising an organic solvent-soluble condensation polymer in the organic solvent, predrying the resulting coating film until the coating film has a residual solvent content of 10 to 40% by weight to obtain a predried laminate comprising the predried heat-resistant resin layer and the metal foil, and (C) heat-treating the above predried laminate.

(9) The method according to item (9), which further comprises step (B) of winding up, in the form of a roll, the predried laminate obtained in step (A) in such a manner that its coated surface does not come into contact with its uncoated surface.

(10) The method according to items (9) or (10), wherein the predrying in step (A) is carried out at a temperature 70° C. to 130° C. lower than the boiling point of the solvent used for preparing the heat-resistant resin solution.

(11) The method according to any of item (9), wherein the heat-treating in step (C) is carried out under reduced pressure and/or in an inert gas atmosphere, while removing the solvent such that the heat-resistant resin layer has an insoluble content of 1% to 99%.

(12) The method according to any one of items (9) to (11), wherein in step (C), the predried laminate is dried under reduced pressure at 200 to 400° C. to reduce the residual solvent content to 5% by weight or lower and then heating the laminate in an inert gas at 200 to 400° C. for 1 to 30 hours.

(13) The method according to item (10), wherein step (A) comprises applying the heat-resistant resin solution to the metal foil to leave the lengthwise borders on either edge uncoated, predrying the applied resin solution (heat-resistant resin layer) to obtain a predried laminate comprising the predried heat-resistant resin layer and the metal foil and step (B) comprises placing a tape made of a material different from that of the laminate on the uncoated portions of the predried laminate or covering both lengthwise edges of the predried laminate with the tape, when winding up the metal foil.

(14) The method according to any one of items (9) to (14), wherein the heat-resistant resin is an organic solvent-soluble polyimide and/or polyamide-imide.

(15) The method according to items (9) to (15), wherein the heat-resistant resin comprises the unit represented by formula (1)

(1)

wherein $R^1$ and $R^2$ are the same or different and each represents hydrogen or an alkyl or alkoxy group having 1 to 4 carbon atoms and/or the unit represented by formula (2)

(2)

(16) A flexible metal-clad laminate which is produced by the method according to any one of items (9) to (16).

(17) A flexible printed wiring board which is obtainable from the flexible metal-clad laminate according to any one of items (1) to (8).

(18)

DETAILED DESCRIPTION OF THE INVENTION

Metal Foil

The metal foil for use in the present invention may be a copper foil, an aluminium foil, a steel foil, a nickel foil or the like, a composite metal foil comprising these metal foils or a metal foil treated with zinc, a chromium compound or other metals. The thickness of the metal foil is not particularly limited. For example, a metal foil having a thickness ranging from 3 to 50 μm is favorably used.

The metal foil is usually in the form of a ribbon, and its length is not particularly limited. The width is not particularly limited either, but is generally about 25 to 300 cm, particularly preferably about 50 to 150 cm.

Heat-resistant Resin

The heat-resistant resin used in the present invention may be basically any resin which has a coefficient of thermal expansion as high as the metal foil and high heat resistance. The heat-resistant resin is preferably a condensation polymer, in particular, an aromatic polyimide and/or aromatic polyamide-imide obtained by a polycondensation reaction. The aromatic polyimide and aromatic polyamide-imide can be synthesized by conventional methods, for example, the isocyanate method, the acid chloride method, the low-temperature solution polymerization method, the room-temperature solution polymerization method, among others.

<(A) Aromatic Polyimide>

Examples of raw materials (acid component and amine component) for the aromatic polyimide include the following.

Examples of useful acid components include monoanhydrides, dianhydrides, esterified compounds, etc., of pyromellitic acid, benzophenone-3,3',4,4'-tetracarboxylic acid, biphenyl-3,3',4,4'-tetracarboxylic acid, diphenylsulfone 3,3',4,4'-tetracarboxylic acid, diphenylether-3,3',4,4'-tetracarboxylic acid, naphthalene-2,3,6,7-tetracarboxylic acid, naphthalene-1,2,4,5-tetracarboxylic acid, naphthalene-1,4,5,8-tetracarboxylic acid and the like. These substances may be used singly or as mixtures of two or more species.

Examples of amine components include p-phenylenediamine, m-phenylenediamine, 3,4'-diaminodiphenylether, 4,4'-diaminodiphenylether, 4,4'-diaminodiphenylsulfone, 3,3'-diaminodiphenylsulfone, 3,4'-diaminobiphenyl, 3,3'-diaminobiphenyl, 3,3'-diaminobenzanilide, 4,4'-diaminobenzanilide, 4,4'-diaminobenzophenone, 3,3'-diaminobenzophenone, 3,4'-diaminobenzophenone, 2,6-tolylenediamine, 2,4-tolylene-diamine, 4,4'-diaminodiphenylsulfide, 3,3'-diaminodiphenylsulfide, 4,4'-diaminodiphenylpropane, 3,3'-diaminodiphenylpropane, 4,4'-diaminodiphenylhexafluoropropane, 3,3'-diaminodiphenylhexafluoropropane, 3,3'-diaminodiphenylmethane, 4,4'-diaminodiphenylmethane, 4,4'-diaminodiphenylhexafluoroisopropylidene, p-xylenediamine, m-xylenediamine, 1,4-naphthalenediamine, 1,5-naphthalenediamine, 2,6-naphthalenediamine, 2,7-naphthalenediamine, o-tolidine, 2,2'-bis(4-aminophenyl)propane, 2,2'-bis(4-aminophenyl)hexafluoropropane, 1,3-bis(3-aminophenoxy)benzene, 1,3-bis(4-aminophenoxy)benzene, 1,4-bis(4-aminophenoxy)benzene, 2,2-bis[4-(4-aminophenoxy)phenyl]propane, bis[4-(4-aminophenoxy)phenyl]sulfone, bis[4-(3-aminophenoxy)phenyl]sulfone, bis[4-(3-aminophenoxy)phenyl]propane, bis[4-(3-aminophenoxy)phenyl]hexafluoropropane, 4,4'-bis(4-aminophenoxy)biphenyl, 4,4'-bis(3-aminophenoxy)biphenyl, 2,2-bis[4-(4-aminophenoxy)phenyl]hexafluoropropane, and the diisocyanates corresponding to these compounds, among others. These components may be used singly or as mixtures of two or more species.

Further, resins prepared by polymerization of any combinations of these acid components and amine components may also be used as blended.

<(B) Aromatic Polyamide-imide>

Examples of raw materials used for the aromatic polyamide-imide include the following acid components and amine components.

The acid components include trimellitic anhydride, diphenylether-3,3',4'-tricarboxylic anhydride, diphenylsulfone-3,3',4'-tricarboxylic anhydride, benzophenone-3,3',4'-tricarboxylic anhydride, naphthalene 1,2,4-tricarboxylic anhydride and like tricarboxylic anhydrides. These substances may be used singly or as mixtures.

Examples of the amine components include the diamines and diisocyanates which are mentioned as examples in item "(A) aromatic polyimide" above, and these substances may be used singly or as a mixture.

Further, resins prepared by polymerization of any combinations of these acid components and amine components may also be used as blended.

Particularly preferable heat-resistant resins in terms of heat resistance, chemical resistance, alkali resistance, coefficient of thermal expansion (thermal gradient dimensional change), processability in the form of a roll, production cost, etc. are aromatic polyimides and aromatic polyamide-imides which are soluble in an organic solvent. More preferable are aromatic polyamide-imides containing the unit represented by formula (1) or (2).

(1)

wherein $R^1$ and $R^2$ may be the same or different and each represents hydrogen or an alkyl or alkoxy group having 1 to 4 carbons atoms.

(2)

The heat-resistant resin for use in the present invention preferably has a molecular weight corresponding to an inherent viscosity in N-methyl-2-pyrrolidone (polymer density: 0.5 g/dl) at 30° C. of 0.3 to 2.5 dl/g, more preferably 1.0 to 2.0 dl/g. A resin with an inherent viscosity not higher than 0.3 dl/g has insufficient mechanical characteristics such as bendability and initiation tear strength of the laminate. On the other hand, an inherent viscosity not lower than 2.0 dl/g results in reduced adhesion and increased solution viscosity, making forming and processing difficult.

In the preparation of aromatic polyimide and aromatic polyamide-imide for use in the present invention, other substances may be used insofar as heat resistance and coefficient of thermal expansion are not deteriorated. Such other substances include acid components such as adipic acid, azelaic acid, sebacic acid, cyclohexane-4,4'-dicarboxylic acid, butane-1,2,4-tricarboxylic acid, butane-1,2,3,4-tetracarboxylic acid, cyclopentane-1,2,3,4-tetracarboxylic acid and like aliphatic and alicyclic dicarboxylic acids, polycarboxylic acids and monoanhydrides, dianhydrides and esterified compounds of these substances; amine components such as tetramethylenediamine, hexamethylenediamine, isophorone diamine, 4,4'-dicyclohexylmethanediamine, cyclohexane-1,4-diamine, diaminosiloxane and like aliphatic and alicyclic diamines and diisocyanates corresponding to these substances. The aliphatic and alicyclic diamines and diisocyanates may be used singly or as mixtures of two or more species. Resins prepared by combining and polymerizing any of these acid components and amine components may also be used as blended.

Method for Producing Flexible Metal-clad Laminate

In the present invention, the heat-resistant resin film can be produced by a method comprising the steps of, for example, (A) applying a heat-resistant resin solution to the above metal foil, predrying the coating film (hereinafter referred to as "predrying step") and (C) heat-treating and drying the resulting laminate comprising the metal foil and the predried coating film obtained in the above step (A) (hereinafter referred to as "heat-treating and solvent removing step"). Thus, the flexible metal-clad laminate of the invention is produced. If necessary, step (B) may be employed, in which a laminate of the metal foil and the predried coating film obtained in the above step (A) is wound up in the form of a roll in such a manner that the coated surface and the uncoated surface of the laminate do not contact.

<Heat-Resistant Resin Solution>

A useful solvent for preparing the above heat-resistant resin solution for use in the present invention is an organic solvent which can dissolve the above heat-resistant resin. Typical examples of such an organic solvent include N-methyl-2-pyrrolidone, N,N'-dimethylformamide, N,N'-dimethylacetamide, 1,3-dimethyl-2-imidazolidinone, tetramethylurea, sulfolane, dimethylsulfoxide, γ-butyrolactone, cyclohexanone, cyclopentanone and the like. Among these, N-methyl-2-pyrrolidone is preferable. When any of these solvents is used as a polymerization solvent, it can be used as it is.

Part of these solvents can be substituted by toluene, xylene and like hydrocarbon-based organic solvents, diglyme, triglyme, tetrahydrofuran and like ether-based organic solvents, methyl ethyl ketone, methyl isobutyl ketone and like ketone-based organic solvents.

In order to improve various characteristics of the flexible metal-clad laminate, e.g., mechanical characteristics, electrical characteristics, slippage, flame-resistance and other characteristics, the heat-resistant resin solution of the invention may contain, or may be used after being reacted with, other resins, organic compounds and/or inorganic compounds, if necessary. Examples thereof include lubricants (silica, talc, silicone, etc.), adhesion promoters, flame retardants (phosphorus-based compounds, triazine-based compounds, aluminum hydroxide, etc.), stabilizers (antioxidants, ultraviolet absorbers, polymerization inhibitors, etc.), electroplating activators, organic and inorganic fillers (talc, titanium oxide, fine particles of fluorine-containing polymers, pigments, dyes, calcium carbide, etc.), silicone compounds, fluorine compounds, isocyanate compounds, block isocyanate compounds, acrylic resins, urethane resins, polyester resins, polyamide resins, epoxy resins, phenol resins and like resins and organic compounds, curing agents of these resins, silicon oxides, titanium oxides, calcium carbonate, iron oxides and like inorganic compounds. These compounds may be used as long as they do not adversely affect the object of the present invention.

The concentration of the heat-resistant resin in the thus obtained heat-resistant resin solution may be selected from a wide range, but preferably is about 5 to 40% by weight, particularly about 8 to 20% by weight. When the concentration is outside the above range, the coating property of the resin is likely to decrease. When the concentration is lower than 5% by weight, curling in resulting laminate tends to be greater.

<(A) Predrying Step>

In the predrying step (A) of the present invention, the above heat-resistant resin solution is applied to the metal foil, and the coating is dried.

The method for applying the solution is not particularly limited and may be any conventionally known method. For example, a coating solution, i.e., a heat-resistant resin solution, adjusted to a suitable viscosity, can be applied with a roll coater, knife coater, doctor, blade coater, gravure coater, die coater, reverse coater or the like, directly to the metal foil.

Figure 1:
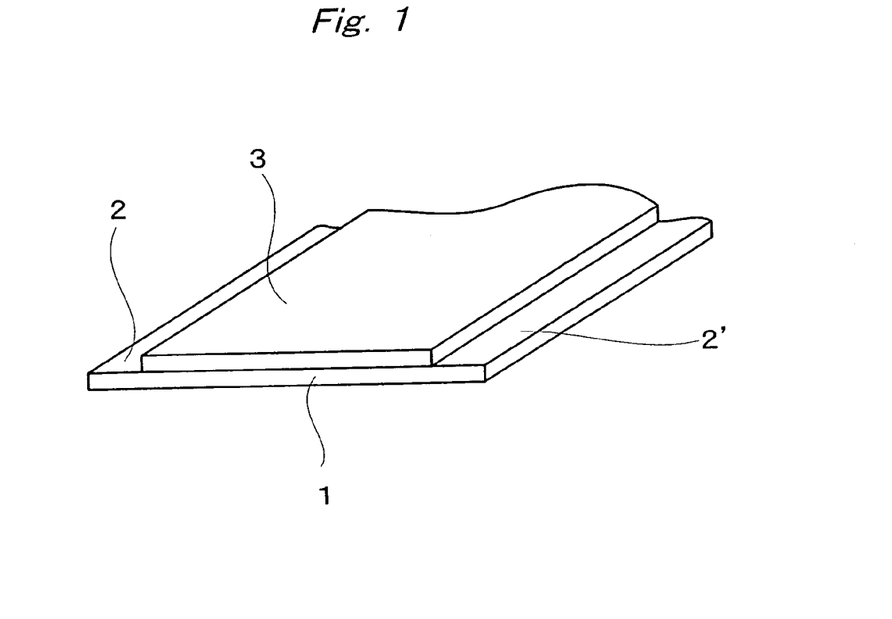
FIG. 1 is a schematic diagram showing an embodiment of the metal foil on which a heat-resistant resin solution is applied leaving lengthwise borders on either edge uncoated.

Suitable solution viscosity ranges from 1 to 1000 Poise in Brookfield viscosity at 25° C. In the application of the solution, to increase the processability of rolling up the laminate in step (B), which will be explained below, both lengthwise edges 2 and 2' of the metal foil 1 are preferably left uncoated, as shown in FIG. 1. In FIG. 1, an applied resin solution (heat-resistant resin layer) is shown at 3.

In the present invention, the residual solvent content in the predried heat-resistant resin layer or the residual solvent content in the heat-resistant resin layer immediately before being subjected to heat-treatment and solvent removal need to be at least 10% by weight. The higher the residual solvent content is, the less curling occurs in the resulting flexible printed wiring board.

In the present specification, the term "residual solvent content" means the amount of solvent in a resin system containing solvent after the predrying step. The residual solvent content is calculated by equation (3) in Examples.

When the residual solvent content is lower than 10% by weight, internal stress caused by a decrease in the volume of solvent cannot be reduced under the treatment conditions of the invention. Therefore, reducing curling in the metal-clad laminate is generally made difficult and heat-resistant resin film obtained by removing the metal foil by etching tends to curl, making circuit processing difficult. Although a higher residual solvent content causes less curling in a metal-clad laminate, excessively high residual solvent content is not favorable since the resin layer formed by coating may undergo sagging and becomes adherent and thus the processability in the form of a roll is lowered. Although the residual solvent content after the predrying varies depending on the type of the resin, it is at most 40% by weight, preferably 30% or less by weight.

The predrying is preferably carried out at a temperature 70° C. to 130° C. lower than the boiling point (Tb (° C.)) of the solvent used for the heat-resistant resin solution. A drying temperature higher than (Tb–70)° C. increases the unevenness of the remaining solvent in the direction of the thickness of the resin layer even when the residual solvent content is 10% by weight or higher. In particular, since the residual solvent content in the resin surface layer is reduced, the reduction of internal stress in later steps becomes insufficient and thus curling is likely to occur in the metal-clad laminate. A drying temperature lower than (Tb–130)° C. prolongs the drying time and thus may lower productivity. The drying temperature required can be varied depending on the type of the solvent, but is generally about 60 to 150° C., particularly about 80 to 120° C.

The time required for predrying may be any period of time effective for achieving the above-specified residual solvent content under the above temperature conditions. The predrying time is generally about 1 to 30 minutes, particularly about 2 to 15 minutes.

The predrying may be conducted by a conventional method such as the roll support system, floating system, among others. In this manner, the predried laminate comprising the predried heat-resistant resin coating film and a metal foil is obtained.

<(C) Heat-treating and Solvent Removing Step>

The heat-treating and solvent removing step in the present invention is carried out by any of the following methods: (I) heating under reduced pressure the predried laminate obtained in the above predrying step; (II) heating the predried laminate in an inert gas atmosphere; (III) heating the predried laminate under reduced pressure and in an inert gas atmosphere; and other methods. Examples of the inert gas include nitrogen, carbon dioxide, helium, argon, etc. Among these, nitrogen is favorable because it is readily available.

Conducting the above heat-treating and solvent removing step in air causes deterioration of the resin layer and/or excessive crosslinking, which increases curling in the substrate and lowers the mechanical characteristics of the resin layer. In addition, when the heat treatment is carried out in air or in an atmosphere containing oxygen while a solvent such as N-methyl-2-pyrrolidone is present in the above-specified amount, not only the mechanical characteristics of the resin layer but also the adhesion between the resin layer and metal foil is lowered.

The above heat-treating and solvent removing step is preferably carried out by heating under reduced pressure, or more preferably by preliminarily reducing the residual solvent content to 5% by weight or lower under reduced pressure and then heating in an inert gas atmosphere.

Particularly, when preliminarily reducing the residual solvent content to 5% by weight or lower under reduced pressure and heating in an inert gas atmosphere, a flexible metal-clad laminate that does not curl and high heat resistance can be obtained by conducting step (C) in the following 2 steps: (i) reducing the residual solvent content to 5% by weight or lower under reduced pressure while keeping the insoluble content of the solvent-removed predried resin to 20% or lower, and then (ii) further carrying out heating at a high temperature in an inert gas atmosphere.

In the present specification, the terms "insoluble content" and "N-methyl-2-pyrrolidone-insoluble content" mean insoluble content of the resin layer of the laminate, which is determined by removing the metal foil from the laminate, after heat-treatment and solvent removal, to leave the resin layer only, and adding the resin layer to N-methyl-2-pyrrolidone in an attempt to prepare a solution having a concentration of 0.5 weight % and maintaining the solution at 100° C. for 2 hours. The "insoluble content" and "N-methyl-2-pyrrolidone-insoluble content" are calculated by the equation (4) in Examples.

The heat-treating and solvent removing are conducted under such temperature and time conditions that the insoluble content of the coated resin layer becomes 1% to 99%, preferably 5% to 85%, after finishing the heat-treating and solvent removing step. When the insoluble content is lower than 1%, solder heat resistance and like heat resistance and chemical resistance, especially alkali resistance become insufficient. When the insoluble content is higher than 99%, the metal-clad laminate has increased curling and lower flexibility. More specifically, the heat-treating and solvent removing step is carried out at $(Tg-250)°$ C. to $(Tg+50)°$ C. Herein, the term "Tg" means the glass transition temperature of the heat-resistant resin expressed in Celsius.

One of the goals of the present invention is to completely remove the solvent from a laminate, optionally in the form of a roll, while reducing the internal stress caused by the decrease in the volume of the solvent. Heat treatment at a higher temperature, preferably at a temperature higher than the glass transition temperature of the heat-resistant resin containing no solvent, effectively reduces stress. However, an excessively high temperature induces excessive crosslinking and degradation in the resin. This increases internal strain and curling in the metal-clad laminate. This temperature may vary depending on the long-term heat resistance of the heat-resistant resin. In the present invention, the temperature needs to be $(Tg+50)°$ C. or lower. Further, when the heat-treating and solvent removing temperature is lower than $(Tg-250)°$ C., it takes a long time to carry out the crosslinking reaction to correct the curl in the laminate and to increase the insoluble content, lowering productivity.

Considering the above, when the heat-treating and solvent removing step is carried out by heating under reduced pressure (method (I) above), it is advantageously carried out under a pressure of about $10^{-5}$ to $10^3$ Pa, preferably about $10^{-1}$ to 200 Pa, at a heating temperature of about 250 to 450° C., preferably about 300 to 400° C., and for about 1 to 30 hours, preferably about 10 to 20 hours.

In addition, when the heat-treating and solvent removing step is performed by heating in an inert gas atmosphere (method (II) above), it is advantageously performed under a pressure of about $10^4$ to $2\times10^4$ Pa, preferably about $10^4$ to $1.1\times10^4$ Pa, at a heating temperature of about 200 to 400° C., preferably about 250 to 350° C., and for about 1 to 30 hours, preferably about 1 to 10 hours.

When the heat-treating and solvent removing step is carried out by preliminarily reducing the residual solvent content to 5% by weight or lower under reduced pressure, followed by heating in an inert gas atmosphere (method (III) above), it is advantageously carried out in the following manner. In the above step (i), i.e., the step in which residual solvent content is reduced to 5% by weight or lower while keeping the insoluble content of the coated resin layer at 20% or lower, it is preferable to heat the coated resin layer under a pressure of, for example, about $10^{-5}$ to 1000 Pa, particularly about $10^{-1}$ to 200 Pa, at a temperature of about 200 to 400° C., particularly about 200 to 300° C., for about 1 to 30 hours, particularly about 10 to 20 hours. In the above step (ii), i.e., the step in which further heating is conducted in an inert gas atmosphere, the heating condition varies depending on the type, molecular weight, Tg, residual solvent content after the above step (i), etc., of the heat-resistant resin. In general, it is preferable that the heating temperature is about 200 to 400° C., particularly about 250 to 350° C., and that the heating time is about 1 to 30 hours, particularly about 1 to 10 hours. The pressure of the inert gas atmosphere may be selected from a wide range, and generally is about 10000 to 20000 Pa, preferably about 10000 to 11000 Pa.

<(B) Winding Step>

In the present invention, the metal foil (predried laminate) which has a resin layer produced by applying a resin solution and predrying the laminate to leave therein the above-specified amount of solvent in the above step (A) may optionally be wound up in the form of a roll. The winding is done in such a manner that the surface coated with the resin solution and the surface not coated with the resin solution do not come into contact, and then the predried laminate is subjected to step (C).

When the winding step is conducted, the diameter of the roll is about 1 to 30 inches, preferably about 3 to 10 inches. The diameter of the roll, however, is not limited to this range. It is generally preferable to make the diameter of the roll small when the heat-resistant resin layer is thick after a thorough-drying and to make the diameter large when the heat-resistant resin layer is thin after a thorough-drying.

In order to prevent the coated surface and uncoated surface from coming into contact, various methods can be employed. For example, the laminate may be loosely wound; a tape made of a material different from that of the laminate can be placed between the layers of the predried laminate; etc.

Figure 2:
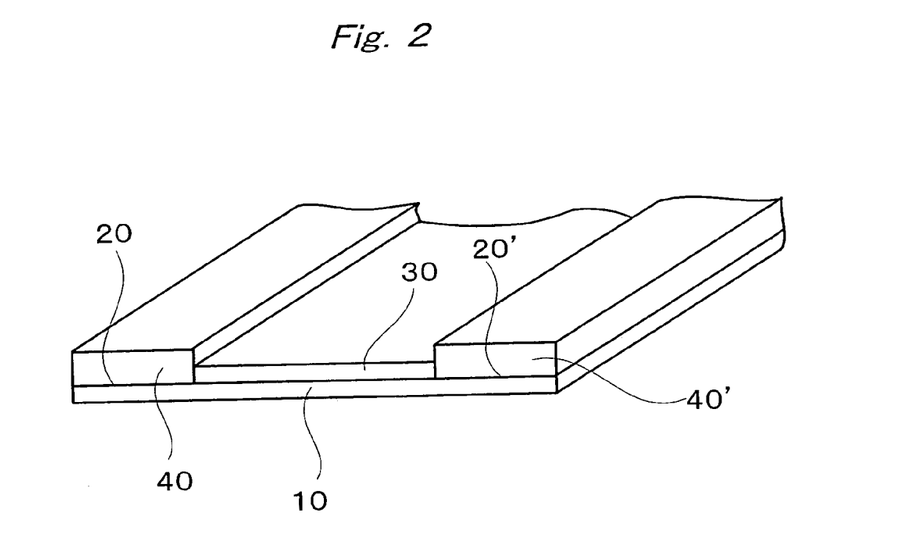
FIG. 2 is a schematic diagram showing an embodiment of the predried laminate in which tape is placed between the uncoated portions of the laminate.

The placement of the tape is not particularly limited. A preferable example of a method for placing the tape is, as shown in FIG. 2, applying a predried product 30 of the heat-resistant resin solution to a metal foil 10 avoiding both lengthwise edges 20 and 20' of the metal foil 10, and placing tapes 40 and 40' on the portions 20 and 20' of the coated surface where no resin solution has been applied. The tapes 40 and 40' may be placed before or after the heat-resistant resin solution applied forms the predried product 30. The tapes are preferably placed during the winding step after the predried product 30 is formed.

Figure 3:
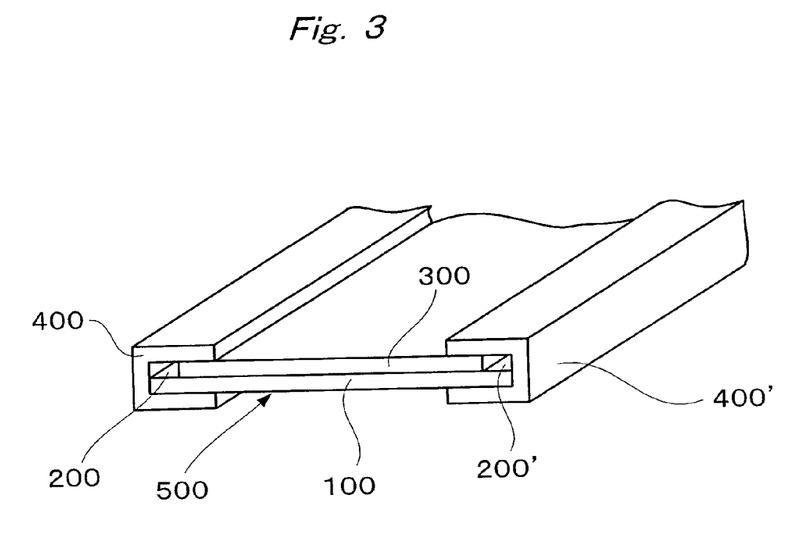
FIG. 3 is a schematic diagram showing an embodiment of the predried laminate in which both lengthwise edges are covered with tape.

More preferably, as shown in FIG. 3, both sides of a predried laminate 500 comprising a metal foil 100 and a predried heat-resistant resin layer 300 are covered with tapes 400 and 400' and the laminate is wound. In FIG. 3, the predried laminate 500 has uncoated portions 200 and 200'. However, the heat-resistant resin layer 300 may be formed across the entire width of the metal foil 100 without leaving the uncoated portions 200 and 200'.

Materials for the tape may be selected from substances which do not deform by shrinking, softening or melting at the heat-treating and solvent removing temperature. Preferably, the tape comprises a woven fabric or a nonwoven fabric, made of cellulose, glass, carbon, aramid, etc., among others.

The thickness of the tape needs to be greater than or equal to that of the coated resin solution. Otherwise, especially when the residual solvent content is high, the coated surface and uncoated surface will come into contact, thereby lowering productivity. A width of the tape is about 5 to 100 mm. The width of 5 mm or less lowers workability, particularly when covering the laminate with the tape. The width of 100 mm or more lowers the efficiency of solvent removal and degrades the appearance of the coated surface since the area which contacts the coated surface increases (or a wider uncoated surface is required). This results in a lowered yield.

In the above winding step (B), when using tape, after the completion of step (C), the portion which is covered with tape is cut off and the reminder is wound onto a paper tube to prepare the final product. The paper tube preferably has a large diameter ranging from about 3 to 10 inches in order to avoid curling that would otherwise be caused by the winding.

Flexible Metal-clad Laminate

Figure 4:
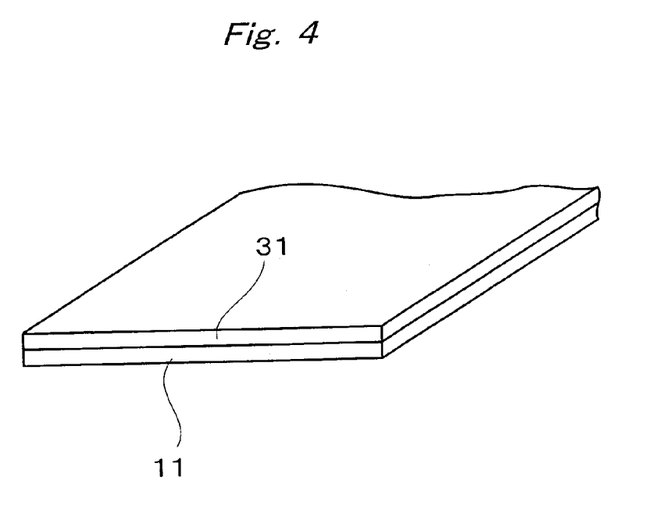
FIG. 4 is a schematic diagram showing an embodiment of the flexible metal-clad laminate of the present invention.

As shown in FIG. 4, the flexible metal-clad laminate of the present invention produced by a method comprising the above steps (A) and (C) or a method comprising the above steps (A), (B) and (C) is characterized in that it comprises the metal foil 11 and the heat-resistant resin film 31 comprising a condensation polymer and formed on one side of the metal foil, the heat-resistant resin film 11 having an N-methyl-2-pyrrolidone-insolule content of 1% or higher, particularly 1 to 99%.

The flexible metal-clad laminate of the present invention is characterized in that it is produced by laminating (e.g., by applying a solution containing an organic solvent and a condensation polymer to a metal foil and drying the laminate) the metal foil 11 and the heat-resistant resin film 31 comprising an organic solvent-soluble condensation polymer and formed on one side of the metal foil. The flexible metal-clad laminate is also characterized in that the heat-resistant resin film 31 contains the above crosslinked condensation polymer and that the heat-resistant resin film has an N-methyl-2-pyrrolidone-insoluble content of at least 1% after being laminated.

The heat-resistant resin film of the flexible metal foil laminate of the present invention has initiation tear strength (film thickness: 20 μm) of 15 kg or more and a thermal gradient dimensional change when heated at 200° C. for 30 minutes of 0.1% or lower.

The flexible metal foil laminate of the invention has solder heat resistance of 350° C. or higher, adhesion between the metal layer and heat-resistant resin film of 80 g/mm or higher and radius of curvature of 15 cm or greater.

Further, the heat-resistant resin film has elastic modulus retentivity of 40% or higher when immersed in an aqueous solution of sodium hydroxide (concentration: 40% by weight) at 25° C. for 100 hours.

The above initiation tear strength, solder heat resistance, adhesion, radius of curvature of a curl and elastic modulus retentivity are measured by the methods described below in Examples.

In the present invention, the average surface roughness (Ra) of the area of the heat-resistant resin film layer which contacts the metal foil on which it is formed is preferably 0.4 μm or less. When the average surface roughness is greater than 0.4 μm, the resin film layer after the metal foil is removed by etching curls, thereby making circuit processing difficult. In the present specification, average surface roughness Ra is measured according to the method of JIS B0601.

The average surface roughness Ra of a heat-resistant resin film layer can be lowered by using a metal foil having a coated surface with low surface roughness (particularly Ra is 0.6 μm or lower, particularly about 0.1 to 0.4 μm) and/or by adjusting the viscosity of the coating solution and drying conditions, especially predrying conditions. In the latter case, it is preferable that the viscosity of the coating solution be adjusted to about 10 to 500 Poise and that the drying is carried out as quickly as possible, particularly at (Tb−70)° C. to (Tb−100)° C. for about 2 to 15 minutes.

In the flexible metal-clad laminate of the invention comprising the heat-resistant resin film layer and metal foil, the thickness of the heat-resistant resin film layer may be selected from a wide range. The thickness is generally about 5 to 100 μm, preferably about 10 to 50 μm after a thorough-drying. When the thickness is less than 5 μm, mechanical properties such as film strength and handling properties are lowered. On the other hand, when the thickness is greater than 100 μm, flexibility and like characteristics and processability (drying property, coating property) and the like are likely to be lowered.

Flexible Printed Wiring Board

Using the above flexible metal-clad laminate of the invention, for example, a flexible printed wiring board can be produced by the subtractive process and like conventional methods. The thus obtained printed wiring board of the present invention is advantageous in that it curls less, that peeling and blistering in the circuit patterns are inhibited since the printed wiring board has limited curling and high solder heat resistance and that the adhesion of circuit patterns is high, etc. Therefore, the flexible metal-clad laminate of the invention is considerably advantageous in industry.

EXAMPLES

The present invention will be explained below in further detail with Examples. However, the present invention is not limited to the embodiments described in Examples. The following methods of evaluation are used in Examples.

Inherent Viscosity

A condensation polymer was dissolved in N-methyl-2-pyrrolidone so as to attain a polymer concentration of 0.5 g/dl. The solution viscosity and solvent viscosity of the resulting solution at 30° C. were measured with an Ubbelohde's viscometer, and the inherent viscosity was calculated according to the following equation.

$$\text{Inherent viscosity (dl/g)} = [ln(V_1/V_2)]/V_3 \quad (1)$$

In the above equation, $V_1$ represents the solution viscosity measured with an Ubbelohde's viscometer, and $V_2$ represents the solvent viscosity measured with an Ubbelohde's viscometer. $V_1$ and $V_2$ were determined based on the time taken for the polymer solution and the solvent (N-methyl-2-pyrrolidone) to pass through the capillary of the viscometer. $V_3$ is a polymer concentration (g/dl)

Glass Transition Temperature

A resin film layer was obtained by removing the metal foil of a flexible metal-clad laminate of the present invention by etching. The glass transition temperature of the resin film layer was measured by the tension mode using a TMA (thermomechanical analyzer/manufactured by RIGAKU DENKI Co., Ltd.). The conditions for the measurement are as shown below. The measured film was heated in a nitrogen environment to point of inflection at a heating rate of 10° C./min., and then was cooled to room temperature before being tested.

Load: 1 g
Sample size: 4 (width)×20 (length) mm
Heating rate: 10° C./min.
Atmosphere: nitrogen Residual Solvent Content The residual solvent content in a predried laminate (comprising a predried coating film of a heat-resistant resin solution and a metal foil) or a flexible metal-clad laminate obtained as the final product (in connection with this item, predried laminates and flexible metal-clad laminates are collectively referred to as "metal-clad laminates") was determined according to JIS K5400 under the drying conditions of 250° C. for 1 hour. The residual solvent content was calculated by the equation (3) below.

More specifically, the metal-clad laminate was thoroughly dried at 250° C. for 1 hr. Then the weight of the metal foil was determined by removing the metal foil by etching. The weight of the metal foil was subtracted from the weight of the metal-clad laminate before the thorough-drying to determine the weight of <resin+solvent>. The weight of the solvent was determined from the change in the weight of the metal-clad laminate before and after the thorough-drying. The residual solvent content was calculated by equation (3).

$$\text{Residual Solvent Content (\%)} = [(RSM-RM)/(RSM-M)] \times 100 \quad (3)$$

where RSM represents the weight (g) of the metal-clad laminate before the thorough-drying, RM represents the weight (g) of the metal-clad laminate after the thorough-drying, and M represents the weight (g) of the metal foil.

Measurement of Insoluble Content

A flexible metal-clad laminate was immersed in ferric chloride at 40° C. (concentration: 35% by weight) to etch and remove the metal foil therefrom. The obtained resin film was dissolved in N-methyl-2-pyrrolidone, giving a 0.5% by weight solution of the resin film layer in N-methyl-2-pyrrolidone. The solution was prepared using a 100 ml Erlenmeyer flask.

Subsequently, this solution was heat-treated at 100° C. (by immersing the Erlenmeyer flask in an oil bath at 100° C.) for 2 hours. The Erlenmeyer flask was cooled to room temperature. The insolubles in the Erlenmeyer flask was collected by filtration using a glass filter (No. 3G-2) while being washed with 100 ml of N-methyl-2-pyrrolidone.

Thereafter, the glass filter with the insolubles was dried in vacuum at 200° C. for 20 hours. The weight of the dried glass filter was measured. From this weight was subtracted the original weight of the glass filter which had been preliminarily measured, thereby determining the weight of the insolubles. The insoluble content was calculated from the weight of the insolubles (Mi) and the weight of the resin film (Mf) by the following equation.

$$\text{Insoluble content (\%)} = [Mi/Mf] \times 100 \quad (4)$$

where Mi represents the weight (g) of the insolubles, and Mf represents the weight (g) of the resin film.

Curling

Figure 5:
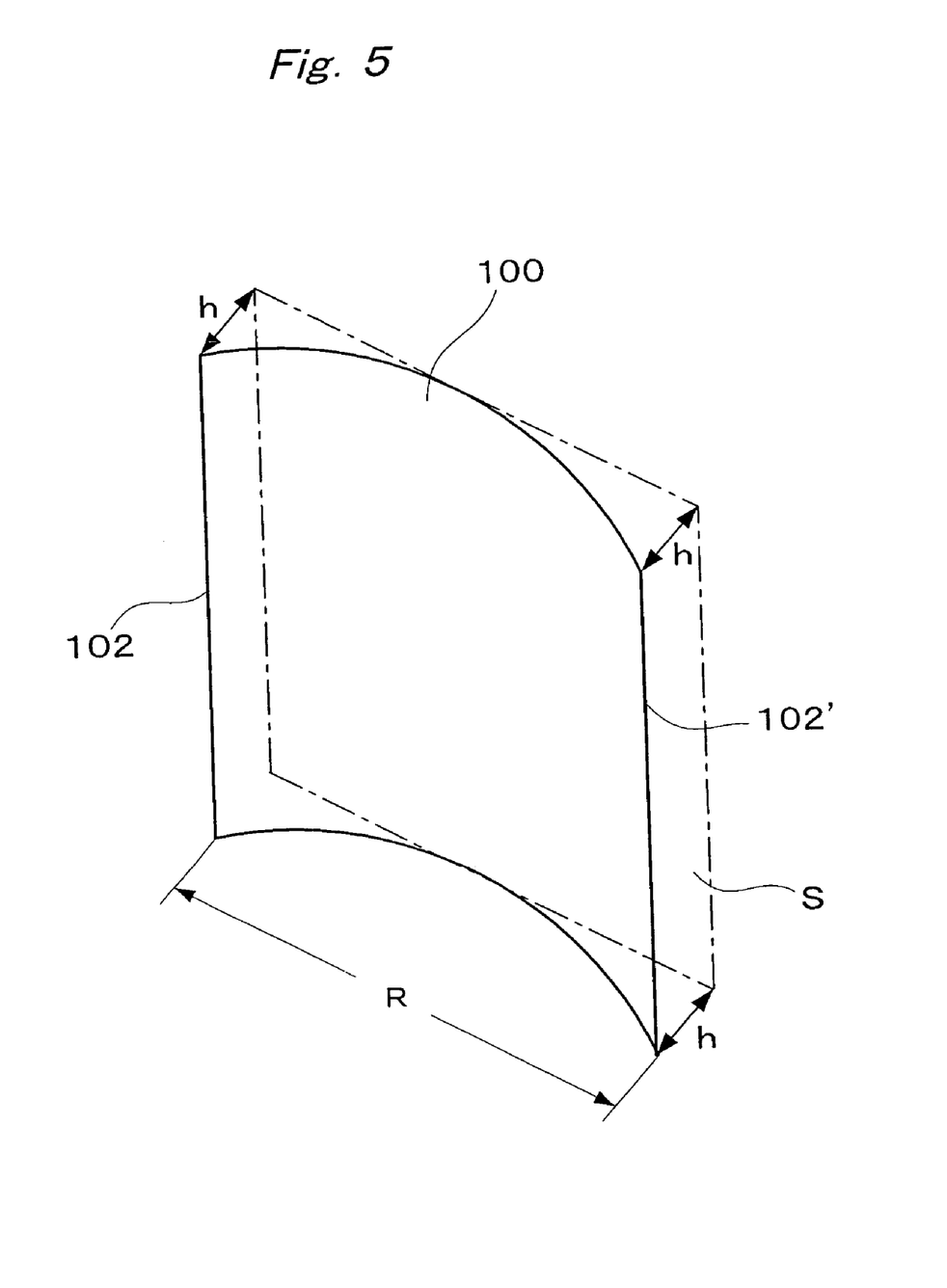
FIG. 5 is a schematic diagram showing a curled flexible metal-clad laminate.

As shown in FIG. 5, a flexible metal-clad laminate (sample size: 10 cm×10 cm) or a heat-resistant resin film (sample size: 10 cm×10 cm) obtained by etching the metal foil from a flexible metal-clad laminate was left in a free state (the state that weight is not applied in the direction of curling). The distance (R) between the ends 102 and 102' which do not lie in the vertical plane S due to curling of the sample 100 and the distance h between the vertical plane S and each of the ends 102 and 102' were measured. The radius of curvature r was calculated by the following equation.

$$\text{Radius of curvature } (r) = (h/2) + (1/8) \times (R^2/h)$$

Solder Heat Resistance

Circuit patterns (1 mm in width) were formed by etching the metal foil of the flexible metal-clad laminate by the subtractive process, giving a sample. This sample was exposed to a temperature of 40° C. and a humidity of 85% for 5 hours for conditioning, subjected to flux cleaning and immersed in a wave solder bath at 350° C. for 10 seconds. The sample was then observed with a microscope for peelings and blisters.

Thermal Gradient Dimensional Change

Thermal gradient dimensional change in the directions of MD and TD was determined according to IPC-FC241 (IPC-TM-650, 2.2.4 (c)) under the conditions of 150° C.×30 min., 200° C.×30 min., and 250° C.×30 min.

Adhesion

The adhesion between the circuit patterns and the heat-resistant resin layer was determined according to IPC-FC241 (TM-650, 2.4.9 (A)) using a sample on which circuit patterns were formed by the subtractive process.

Initiation Tear Strength

A sample (20 mm in width, 200 mm in length) was prepared from a resin film prepared by removing the metal foil therefrom by etching. This sample was tested according to JIS-C2318.

Tensile Strength, Elongation and Elastic Modulus of Resin Film

A resin film was obtained by removing the metal foil therefrom by etching with an aqueous solution of ferric chloride (concentration: 35% by weight) at 40° C. A sample (10 mm in width, 100 mm in length) was prepared from the resin film. The sample was tested with a tensile tester (trade name "Tensilon tensile tester", manufactured by TOYO BALDWIN CO., LTD.) under the following conditions.

Conditioning: 40° C., 85% (humidity)×5 hrs
Drawing rate: 20 mm/min.
Distance between chucks: 40 mm Alkali Resistance Test of Resin Film A heat-resistant resin film was prepared by removing the metal foil therefrom by etching with an aqueous solution of ferric chloride (concentration: 35% by weight) at 40° C. The heat-resistant resin film was immersed in 40% by weight of an aqueous solution of sodium hydroxide for 100 hours. Thereafter, the sample was thoroughly washed and dried. The elastic modulus of the sample was determined under the above conditions. Subsequently, the retentivity of elastic modulus was calculated based on the elastic modulus before and after the immersion.

$$\text{Retentivity of elastic modulus (\%)} = [Ea/Eb] \times 100 \quad (5)$$

wherein Ea represents the elastic modulus after the immersion, and Eb represents the elastic modulus before immersion.

Flexural Endurance

A heat-resistant resin film (10 mm in width) prepared by etching the metal foil was tested for the number of times it could be bent before being broken according to JIS C 5016. In the test, the load was 500 g and the bending radius was 0.38 mm.

Measurement of Surface Roughness (Ra)

A metal foil of the produced flexible metal-clad laminate was removed by etching with ferric chloride (concentration: 35% by weight) at 40° C., giving a resin film sample. The surface of the thus obtained resin film which was contacting a copper foil was traced by a surface texture and contour measuring instrument with differential transformer type pickup (manufactured by TOKYO SEIMITSU CO., LTD.) to determine its surface roughness. The tracing was conducted according to the method of JIS B0601, at a rate of 0.12 mm/min. and cutoff of 0.8 mm.

Synthesis Example 1

Synthesis of Resin A

Into a reaction vessel were placed 192 g of trimellitic acid anhydride (manufactured by MITSUBISHI GAS CHEMICAL COMPANY, INC.), 211 g (80 mol %) of 3,3'-dimethyl-4,4'-biphenyldiisocyanate (manufactured by NIPPON SODA CO., LTD., "O-tolidinediisocyanate"), 35g (20 mol %) of 2,4-tolylene diisocyanate (manufactured by NIPPON POLYURETHANE INDUSTRY CO., LTD., "Coronate T-100"), 0.5 g of sodium methylate (manufactured by WAKO PURE CHEMICALS INDUSTRIES, LTD.) and 2.5 kg of N-methyl-2-pyrrolidone (manufactured by MITSUBISHI CHEMICAL CORPORATION). The mixture was heated to 150° C. over 1 hour and was further reacted at 150° C. for 5 hours. The resulting polymer had an inherent viscosity of 1.6 dl/g and a glass transition temperature of 320° C.

Synthesis Example 2

Synthesis of Resin B

Into a reaction vessel were placed 192 g of trimellitic acid anhydride, 157 g (75 mol %) of 1,5-naphthalenediisocyanate (manufactured by SUMITOMO BAYER URETHANE CO., LTD., "Desmodur 15"), 63 g (25 mol %) of 4,4'-diphenylmethanediisocyanate (manufactured by SUMITOMO BAYER URETHANE CO., LTD.), 1 g of diazabicycloundecene (manufactured by SAN-APRO LIMITED) and 2 kg of N-methyl-2-pyrrolidone. The mixture was heated to 170° C. over 1 hour and further reacted at 170° C. for 5 hours. The resulting polymer had an inherent viscosity of 1.4 dl/g and a glass transition temperature of 356° C.

Synthesis Example 3

Synthesis of Resin B-1

Into a reaction vessel were placed 384 g of trimellitic acid anhydride, 378 g (90 mol %) of 1,5-naphthalenediisocyanate, 50 g (10 mol %) of 4,4'-diphenylmethanediisocyanate, 2.5 g of potassium fluoride (manufactured by TOKYO KASEI KOGYO CO., LTD.) and 2 kg of N-methyl-2-pyrrolidone. The mixture was heated to 130° C. over 1 hour, and further reacted at 130° C. for 5 hours. The resulting polymer had an inherent viscosity of 1.7 dl/g and a glass transition temperature of 381° C.

Synthesis Example 4

Synthesis of Resin B-2

Into a reaction vessel were placed 384 g of trimellitic acid anhydride, 399 g (95 mol %) of 1,5-naphthalenediisocyanate, 25 g (5 mol %) of 4,4'-diphenylmethanediisocyanate, 2.5 g of potassium fluoride and 2 kg of N-methyl-2-pyrrolidone. The mixture was heated to 100° C. over 1 hour, and further reacted at 100° C. for 5 hours. The resulting polymer had an inherent viscosity of 1.8 dl/g and a glass transition temperature of 390° C.

Synthesis Example 5

Synthesis of Resin B-3

Into a reaction vessel were placed 384 g of trimellitic acid anhydride, 210 g (50 mol %) of 1,5-naphthalenediisocyanate, 251 g (50 mol %) of 4,4'-diphenylmethanediisocyanate, 2.5 g of potassium fluoride and 1.5 kg of N-methyl-2-pyrrolidone. The mixture was heated to 150° C. over 1 hour, and further reacted at 150° C. for 5 hours. The resulting polymer had an inherent viscosity of 1.2 dl/g and a glass transition temperature of 367° C.

Synthesis Example 6

Synthesis of Resin A-1

Into a reaction vessel were placed 192 g of trimellitic acid anhydride, 251 g (95 mol %) of 3,3'-dimethyl-4,4'-biphenyl-diisocyanate, 8.7 g (5 mol %) of 2,4-tolylene diisocyanate, 0.5 g of sodium methylate and 2.5 kg of N-methyl-2-pyrrolidone. The mixture was heated to 150° C. over 1 hour, and further reacted at 150° C. for 5 hours. The resulting polymer had an inherent viscosity of 1.7 dl/g and a glass transition temperature of 315° C.

Examples 1 to 12 and Comparative Examples 1 to 5

(A) Predrying Step

Each of the resin solutions obtained in the above Synthesis Examples was continuously applied to a copper foil with a knife coater, leaving a 1 cm lengthwise border on both edges (uncoated) in such a manner that the thickness of the resin layer after removing the solvent therefrom was 20 μm.

The copper foils used in Examples 1 to 12 and Comparative Examples 1 to 4 were rolled copper foils (trade name "BHY-02-BT", manufactured by JAPAN ENERGY CORPORATION) having a surface roughness Ra of 0.35 μm and thickness of 18 μm. The copper foil used in Comparative Example 5 was an electro-deposited copper foil (trade name "NDP-III", manufactured by Mitsui Mining & Smelting Co., Ltd.) having a surface roughness Ra of 0.65 μm and thickness of 18 μm.

Subsequently, the coated metal foils were continuously passed through a floating-type drying furnace which was 20 m long. The speed of the line was adjusted so that the drying conditions shown in Table 1 were attained. The residual solvent contents in the resulting predried resin layers are shown in Table 1.

(B) Winding Step

In Examples 1 to 8 and Comparative Examples 1 to 5, while both lengthwise edges of the coated surfaces of the thus obtained ribbon-shaped laminates were covered with glass cloth tape (1 cm in width and 200 μm in thickness), the laminates were wound on aluminum tubes (3 inches in diameter) with the coated surface facing outward.

In Examples 9 to 11, glass cloth tape (1 cm in width and 300 μm in thickness) was placed on the uncoated area at both lengthwise edges of the ribbon-shaped laminates. The laminates were wound on aluminum tubes (3 inches in diameter) with the coated surface facing outward. In Example 12, as shown in FIG. 3, both uncoated lengthwise edges of the ribbon-shaped laminate were covered with tape. The laminates were wound on aluminum tubes (3 inches in diameter) with the coated surface facing outward.

(C) Heat-treating and Solvent Removing Step

Subsequently, the rolls obtained in the above winding step were heat-treated in a vacuum dryer or an inert oven under the conditions shown in Table 1.

In Table 1, the reduced pressure in column "solvent removing and heat-treating condition" varied from 10 to 100 Pa because of the volatilization of the solvent.

The solvent in the coating film of the obtained flexible metal-clad laminate was completely removed. The characteristics of the laminates are shown in Tables 2 and 3.

The metal foils of the flexible metal-clad laminates obtained in Examples 1 to 12 and Comparative Example 5 were removed by etching with an aqueous solution of ferric chloride (concentration: 35% by weight) at 40° C. The surface roughness Ra of the surfaces of the heat-resistant resin film layers which were contacting the metal foils was determined. The results are shown in Table 3.

In Comparative Example 5, the heat-resistant resin film layer curled with the surface which was contacting the copper foil facing inward and had a radius of curvature of 3 cm. On the contrary, the heat-resistant resin film layers obtained in Examples 1 to 12 were flat.

TABLE 1

| Ex. Comp. Ex. | Resin | Predrying conditions | Residual solvent content after predrying | Solvent removing and heat-treating conditions |
|---|---|---|---|---|
| Ex. 1 | A | 100° C. × 5 min. | 21% | 200° C. (reduced pressure) × 20 hr., 260° C. × 3 hr. (nitrogen) |
| Ex. 2 | A | 100° C. × 5 min. | 19% | 200° C. (reduced pressure) × 20 hr., 280° C. × 3 hr. (nitrogen) |
| Ex. 3 | A | 100° C. × 5 min. | 22% | 200° C. (reduced pressure) × 20 hr., 300° C. × 3 hr. (nitrogen) |
| Ex. 4 | A | 80° C. × 8 min. | 28% | 200° C. (reduced pressure) × 10 hr., 280° C. × 3 hr. (nitrogen) |
| Ex. 5 | A | 100° C. × 5 min. | 20% | 200° C. (reduced pressure) × 10 hr., 280° C. × 3 hr. (nitrogen) |
| Ex. 6 | A | 110° C. × 4 min. | 18% | 200° C. (reduced pressure) × 10 hr., 280° C. × 3 hr. (nitrogen) |
| Ex. 7 | A | 100° C. × 5 min. | 20% | 200° C. (reduced pressure) × 10 hr., 300° C. × 3 hr. (nitrogen) |
| Ex. 8 | B | 100° C. × 5 min. | 20% | 200° C. (reduced pressure) × 10 hr., 280° C. × 3 hr. (nitrogen) |
| Ex. 9 | B-1 | 100° C. × 5 min. | 21% | 200° C. (reduced pressure) × 30 hr., 300° C. × 4 hr. (nitrogen) |
| Ex. 10 | B-2 | 100° C. × 5 min. | 19% | 200° C. (reduced pressure) × 30 hr., 300° C. × 4 hr. (nitrogen) |
| Ex. 11 | B-3 | 100° C. × 5 min. | 19% | 200° C. (reduced pressure) × 30 hr., 300° C. × 4 hr. (nitrogen) |
| Ex. 12 | A-1 | 100° C. × 5 min. | 20% | 200° C. (reduced pressure) × 30 hr., 300° C. × 4 hr. (nitrogen) |
| Comp. Ex. 1 | A | 100° C. × 5 min. | 20% | 200° C. (reduced pressure) × 20 hr. |
| Comp. Ex. 2 | A | 150° C. × 3 min. | 22% | 200° C. (reduced pressure) × 10 hr., 280° C. × 3 hr. (nitrogen) |

TABLE 1-continued

| Ex. Comp. Ex. | Resin | Predrying conditions | Residual solvent content after predrying | Solvent removing and heat-treating conditions |
|---|---|---|---|---|
| Comp. Ex. 3 | A | 100° C. × 5 min. 200° C. × 10 min. | 7% | 200° C. (reduced pressure) × 10 hr., 280° C. × 3 hr. (nitrogen) |
| Comp. Ex. 4 | A | 100° C. × 5 min. | 20% | 180° C. (reduced pressure) × 20 hr. |
| Comp. Ex. 5 | A | 80° C. × 8 min. | 29% | 200° C. (reduced pressure) × 20 hr., 280° C. × 3 hr. (nitrogen) |

TABLE 2

| Ex. Comp. Ex. | | Insoluble content (%) | Solder heat resistance | Curling in metal laminate (cm) | Thermal gradient dimensional change at 150° C. (%) | | Thermal gradient dimensional change at 200° C. (%) | | Thermal gradient dimensional change at 250° C. (%) | |
|---|---|---|---|---|---|---|---|---|---|---|
| | | | | | Direction MD | Direction TD | Direction MD | Direction TD | Direction MD | Direction TD |
| Ex. | 1 | 2 | Fine | None | −0.043 | −0.045 | −0.068 | −0.073 | −0.095 | −0.094 |
| | 2 | 10 | Fine | None | −0.010 | −0.029 | −0.032 | −0.041 | −0.088 | −0.084 |
| | 3 | 76 | Fine | None | 0.023 | −0.024 | −0.039 | −0.040 | −0.073 | −0.088 |
| | 4 | 9 | Fine | None | −0.008 | −0.001 | −0.033 | −0.036 | −0.059 | −0.066 |
| | 5 | 10 | Fine | None | 0.025 | 0.021 | −0.036 | −0.036 | −0.093 | −0.094 |
| | 6 | 10 | Fine | None | −0.037 | 0.008 | −0.045 | −0.052 | −0.094 | −0.089 |
| | 7 | 76 | Fine | None | −0.039 | −0.039 | −0.041 | −0.048 | −0.088 | −0.086 |
| | 8 | 10 | Fine | None | −0.009 | −0.023 | −0.036 | −0.059 | −0.074 | −0.082 |
| | 9 | 22 | Fine | None | −0.008 | −0.001 | | | −0.048 | −0.054 |
| | 10 | 28 | Fine | None | −0.022 | −0.020 | | | −0.049 | −0.052 |
| | 11 | 35 | Fine | None | −0.030 | −0.036 | | | −0.073 | −0.085 |
| | 12 | 29 | Fine | None | −0.029 | −0.031 | | | −0.071 | −0.079 |
| Comp. Ex. | 1 | 1> | Blisters, peelings | 15.0 | −0.054 | −0.054 | −0.101 | −0.123 | | |
| | 2 | 10 | Fine | 5.5 | −0.049 | −0.056 | −0.101 | −0.113 | | |
| | 3 | 10 | Fine | 13.0 | −0.063 | −0.079 | −0.112 | −0.136 | | |
| | 4 | 1> | Blisters, peelings | 14.0 | −0.035 | −0.023 | −0.105 | −0.140 | | |
| | 5 | 10 | Fine | None | −0.035 | −0.038 | −0.044 | −0.049 | | |

TABLE 3

| Ex. Comp. Ex. | | Adhesion (g/mm) | Initiation tear strength (Kg) | Tensile strength (Kg/mm²) | Elongation (%) | Elastic modulus (Kg/mm²) | Elastic modulus retentivity (after immersion in alkali; %) | Flexural endurance (cycle) | Ra (μm) |
|---|---|---|---|---|---|---|---|---|---|
| Ex. | 1 | 114 | 21 | 43 | 53 | 723 | 69 | 10520 | 0.12 |
| | 2 | 97 | 20 | 43 | 60 | 614 | 81 | 11210 | 0.11 |
| | 3 | 111 | 21 | 34 | 45 | 619 | 91 | 6350 | 0.12 |
| | 4 | 105 | 22 | 41 | 61 | 616 | 72 | 8820 | 0.15 |
| | 5 | 91 | 22 | 36 | 60 | 621 | 83 | 8950 | 0.11 |
| | 6 | 115 | 27 | 37 | 57 | 625 | 86 | 10310 | 0.09 |
| | 7 | 105 | 19 | 35 | 53 | 611 | 91 | 6110 | 0.12 |
| | 8 | 145 | 20 | 42 | 56 | 609 | 87 | 3470 | 0.12 |
| | 9 | 89 | 20 | 24 | 11 | 483 | 41 | 6850 | 0.15 |
| | 10 | 87 | 21 | 25 | 22 | 454 | 43 | 6400 | 0.13 |
| | 11 | 101 | 23 | 15 | 39 | 367 | 48 | 5720 | 0.13 |
| | 12 | 111 | 24 | 39 | 46 | 711 | 96 | 6920 | 0.12 |
| Comp. Ex. | 1 | 119 | 20 | 35 | 41 | 681 | 39 | — | — |
| | 2 | — | — | — | — | — | — | — | — |
| | 3 | — | — | — | — | — | — | — | — |
| | 4 | 115 | 20 | — | — | — | — | — | — |
| | 5 | 190 | 23 | 38 | 47 | 693 | 81 | 7920 | 0.53 |

EFFECT OF THE INVENTION

As mentioned above, since the flexible metal-clad laminate of the present invention is prepared by (A) applying a heat-resistant resin solution to a metal foil and drying the solution, (B) winding the laminate (if necessary), and further (C) heat-treating the laminate while removing the solvent therefrom, the flexible metal-clad laminate and heat-resistant resin film produced by removing the metal foil therefrom by etching do not curl and are excellent in dimensional stability, heat resistance and chemical resistance (particularly alkali resistance), hence industrially useful.

The invention claimed is:

1. A method for producing a flexible metal-clad laminate, the method comprising the steps of
   (A) applying to a metal foil a solution prepared by dissolving a heat-resistant resin containing an organic solvent-soluble condensation polymer in an organic solvent and, predrying the resulting coating film until the coating has a residual solvent content of 10 to 40% by weight to obtain a predried laminate comprising the predried heat-resistant resin layer and the metal foil,
   (B) winding up, in the form of a roll, the predried laminate obtained in step (A) in such a manner that its coated surface does not come into contact with its uncoated surface, and
   (C) heat-treating the predried laminate in the form of a roll obtained in step (B) to produce a flexible metal-clad laminate comprising a metal foil and a heat-resistant resin film layer formed on one side of the metal foil, the heat-resistant resin film layer comprising a crosslinked condensation polymer and having an N-methyl-2-pyrrolidone-insoluble content of at least 1%,
   wherein the heat-resistant resin is an organic solvent-soluble aromatic polyimide and/or aromatic polyamide-imide.

2. The method according to claim 1, wherein, in step (B), the laminate is loosely wound or a tape made of a material different from that of the laminate is placed between the layers of the predried laminate.

3. The method according to claim 1, wherein the predrying in step (A) is carried out at a temperature 70° C. to 130° C. lower than the boiling point of the solvent used for preparing the heat-resistant resin solution.

4. The method according to claim 1, wherein the heat-treating in step (C) is carried out under reduced pressure and/or in an inert gas atmosphere, while removing the solvent such that the heat-resistant resin layer has an insoluble content of 1% to 99%.

5. The method according to claim 1, wherein in step (C), the predried laminate is heated under reduced pressure at 200 to 400° C. to reduce the residual solvent content to 5% by weight or lower and then is heated in an inert gas at 200 to 400° C. for 1 to 30 hours.

6. The method according to claim 1, wherein step (A) comprises applying the heat-resistant resin solution to the metal foil to leave the lengthwise borders on either edge uncoated, and predrying the applied resin solution to obtain a predried laminate comprising the predried heat-resistant resin layer and the metal foil, and step (B) comprises placing a tape made of a material different from that of the laminate on the uncoated portions of the predried laminate or covering both lengthwise edges of the predried laminate with the tape, when winding up the predried laminate.

7. The method according to claim 1, wherein the heat-resistant resin is an organic solvent-soluble polyamide-imide aromatic.

8. The method according to claim 1, wherein the heat-resistant resin comprises the unit represented by formula (1)

wherein $R^1$ and $R^2$ are the same or different and each represents hydrogen or an alkyl or alkoxy group having 1 to 4 carbon atoms and/or the unit represented by formula (2)

9. The method according to claim 1, wherein in step (c), the N-methyl-2-pyrrolidone-insoluble content of the heat-resistant resin film layer is 1 to 99%.

* * * * *